(12) United States Patent
Campbell et al.

(10) Patent No.: US 7,301,770 B2
(45) Date of Patent: Nov. 27, 2007

(54) COOLING APPARATUS, COOLED ELECTRONIC MODULE, AND METHODS OF FABRICATION THEREOF EMPLOYING THERMALLY CONDUCTIVE, WIRE-BONDED PIN FINS

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 11/009,935

(22) Filed: Dec. 10, 2004

(65) Prior Publication Data

US 2006/0126308 A1   Jun. 15, 2006

(51) Int. Cl.
*H05K 7/20* (2006.01)
(52) U.S. Cl. .................. 361/699; 361/703; 361/704; 257/714; 165/80.3; 165/80.4; 174/16.3
(58) Field of Classification Search ............... None
See application file for complete search history.

(56) References Cited

U.S. PATENT DOCUMENTS

| | | | |
|---|---|---|---|
| 4,765,400 A * | 8/1988 | Chu et al. ................ 165/185 |
| 5,038,857 A * | 8/1991 | Ciaccio .................. 165/167 |
| 5,083,194 A | 1/1992 | Bartilson ................ 357/81 |
| 5,195,576 A * | 3/1993 | Hatada et al. ............ 165/80.3 |
| 5,381,859 A * | 1/1995 | Minakami et al. ........ 165/80.3 |
| 5,499,450 A * | 3/1996 | Jacoby .................. 29/890.03 |
| 5,535,515 A * | 7/1996 | Jacoby .................. 29/890.03 |
| 5,673,177 A | 9/1997 | Brodsky et al. .......... 361/704 |
| 6,019,165 A | 2/2000 | Batchelder ............. 165/80.3 |

(Continued)

FOREIGN PATENT DOCUMENTS

GB          668270 A          3/1952

(Continued)

*Primary Examiner*—Boris Chervinsky
(74) *Attorney, Agent, or Firm*—Lily Neff, Esq.; Kevin P. Radigan, Esq.; Heslin Rothenberg Farley & Mesiti, P.C.

(57) ABSTRACT

A cooling apparatus and method of fabrication are provided for facilitating removal of heat from a heat generating electronic device. The cooling apparatus includes a thermally conductive base having a substantially planar main surface, and a plurality of thermally conductive pin fins wire-bonded to the main surface of the thermally conductive base and disposed to facilitate the transfer of heat from the thermally conductive base. The thermally conductive base can be a portion of the electronic device to be cooled or a separate structure coupled to the electronic device to be cooled. If a separate structure, the thermally conductive base has a coefficient of thermal expansion within a defined range of a coefficient of thermal expansion of the electronic device. In one implementation, the wire-bonded pin fins are discrete, looped pin fins separately wire-bonded to the main surface and spaced less than 300 micrometers apart in an array.

20 Claims, 9 Drawing Sheets

U.S. PATENT DOCUMENTS

| | | | |
|---|---|---|---|
| 6,141,219 A * | 10/2000 | Downing et al. | 361/704 |
| 6,244,331 B1 * | 6/2001 | Budelman | 165/80.3 |
| 6,578,626 B1 * | 6/2003 | Calaman et al. | 165/80.4 |
| 6,679,315 B2 * | 1/2004 | Cosley et al. | 165/80.4 |
| 6,684,942 B2 | 2/2004 | Song et al. | 165/122 |
| 6,729,383 B1 * | 5/2004 | Cannell et al. | 165/80.3 |
| 6,765,794 B1 | 7/2004 | Inoue | 361/695 |
| 6,771,508 B1 * | 8/2004 | Ghosh | 361/704 |
| 6,817,405 B2 * | 11/2004 | Kamath et al. | 165/80.3 |
| 6,898,082 B2 * | 5/2005 | Dessiatoun et al. | 361/699 |
| 7,000,684 B2 * | 2/2006 | Kenny et al. | 165/80.4 |
| 7,032,651 B2 * | 4/2006 | Winslow et al. | 165/80.4 |
| 2002/0018338 A1 * | 2/2002 | McCullough | 361/709 |
| 2002/0079097 A1 * | 6/2002 | Lee et al. | 165/185 |
| 2004/0150956 A1 * | 8/2004 | Conte | 361/709 |
| 2005/0156013 A1 * | 7/2005 | Bhatti et al. | 228/193 |
| 2005/0280993 A1 * | 12/2005 | Campbell et al. | 361/699 |

FOREIGN PATENT DOCUMENTS

| | | |
|---|---|---|
| GB | 668331 A | 3/1952 |
| GB | 759958 A | 10/1956 |
| JP | 04-243153 A | 8/1992 |
| JP | 2002-190557 A | 7/2002 |

* cited by examiner fig. 1 fig. 2 fig. 3A fig. 3B fig. 3C fig. 3D fig. 3E fig. 3F fig. 3G fig. 4A fig. 4B fig. 4C fig. 6 fig. 7 fig. 8

COOLING APPARATUS, COOLED ELECTRONIC MODULE, AND METHODS OF FABRICATION THEREOF EMPLOYING THERMALLY CONDUCTIVE, WIRE-BONDED PIN FINS

TECHNICAL FIELD

The present invention relates to heat transfer mechanisms, and more particularly, to cooling apparatuses, cooled electronic modules and methods of fabrication thereof for removing heat generated by one or more electronic devices. Still more particularly, the present invention relates to cooling apparatuses and methods employing a plurality of thermally conductive pin fins wire-bonded to a substantially planar main surface of a thermally conductive base, which comprises part of or is coupled to an electronic device to be cooled.

BACKGROUND OF THE INVENTION

As is known, operating electronic devices produce heat. This heat should be removed from the devices in order to maintain device junction temperatures within desirable limits, with failure to remove the heat thus produced resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

Thus, the need to cool current and future high heat load, high heat flux electronic devices, mandates the development of aggressive thermal management techniques, such as liquid cooling using finned cold plate devices. Various types of liquid coolants provide different cooling capabilities. In particular, fluids such as refrigerants or other dielectric liquids (e.g., fluorocarbon liquid) exhibit relatively poor thermal conductivity and specific heat properties, when compared to liquids such as water or other aqueous fluids. Dielectric liquids have an advantage, however, in that they may be placed in direct physical contact with electronic devices and interconnects without adverse affects such as corrosion or electrical short circuits. Other cooling liquids, such as water or other aqueous fluids, exhibit superior thermal conductivity and specific heat compared to dielectric fluids. Water-based coolants, however, must be kept from physical contact with electronic devices and interconnects, since corrosion and electrical short circuit problems are likely to result from such contact. Various methods have been disclosed in the art for using water-based coolants, while providing physical separation between the coolants and the electronic device(s). With liquid-based cooling apparatuses, however, it is still necessary to attach the cooling apparatus to the electronic device. This attachment results in a thermal interface resistance between the cooling apparatus and the electronic device. Thus, in addition to typical liquid cooling issues regarding sealing, clogging due to particulate contamination, thermal conductivity of the cooling apparatus, effectiveness of the interface to the electronic device as well as the thermal expansion match between the cooling apparatus and the electronic device and manufacturability, need to be addressed. The invention disclosed herein presents a high-performance liquid cooling apparatus and method of fabrication that addresses the above-noted considerations for liquid-cooling-based apparatuses.

SUMMARY OF THE INVENTION

The shortcomings of the prior art are overcome and additional advantages are provided through the provision of a cooling apparatus. The cooling apparatus includes a thermally conductive base having a main surface, and a plurality of thermally conductive pin fins wire-bonded to the main surface of the thermally conductive base and disposed to facilitate transfer of heat from the thermally conductive base.

In enhanced aspects, the thermally conductive pin fins may comprise a plurality of discrete, looped pin fins, with each discrete, looped pin fin being separately wire-bonded to the main surface of the thermally conductive base. Additionally, the wire-bonded pin fins may each be diffusion-weld-bonded to and thermally merged with the main surface of the thermally conductive base. A thermally conductive base may either comprise a portion of an electronic device to be cooled, or a separate structure coupled to the electronic device to be cooled. When a separate structure, the thermally conductive base has a coefficient of thermal expansion within a defined range of a coefficient of thermal expansion of the electronic device, the defined range being $\pm 1.5 \times 10^{-6}$ 1/K. Still further, the cooling apparatus may comprise part of a micro-scaled cooling structure, and the thermally conductive pin fins may be spaced less than 300 micrometers apart in a planar array across the main surface of the thermally conductive base.

In another aspect, a cooled electronic module is provided which includes a substrate with at least one heat generating electronic device attached thereto. The module further includes a cooling apparatus for cooling the at least one heat generating electronic device. The cooling apparatus includes a plurality of thermally conductive pin fins wire-bonded to one of a surface of the at least one heat generating electronic device or a thermally conductive base coupled to a surface of the at least one heat generating electronic device, wherein the plurality of thermally conductive pin fins are disposed to facilitate transfer of heat from the one of the surface of the at least one heat generating electronic device or the thermally conductive base coupled to the surface of the at least one heat generating electronic device. In enhanced aspects, the plurality of thermally conductive wire-bonded pin fins and thermally conductive base can include characteristics such as those summarized above.

Methods of fabricating a cooling apparatus and a cooled electronic module, as well as methods for cooling an electronic device are also presented and claimed.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronic device" comprises any heat generating electronic component of a computer system or other electronic system requiring cooling. In one example, the electronic device includes an integrated circuit chip. The term "cooled electronic module" includes any electronic module with cooling and at least one electronic device, with single chip modules and multichip modules being examples of an electronic module to be cooled. As used herein, "micro-scaled cooling structure" means a cooling structure with a characteristic dimension of 200 micrometers (microns) or less.

Generally stated, provided herein is an enhanced cooling apparatus and method of fabrication which allow for high heat transfer from a surface of an electronic device to be cooled using a direct or indirect liquid coolant approach. In one embodiment, the cooling liquid may comprise a water-based fluid, and the cooling apparatus may be employed in combination with a passivated electronic substrate assembly. However, the concepts disclosed herein are readily adapted to use with other types of coolant. For example, the coolant may comprise a brine, a fluorocarbon liquid, a liquid metal, or other similar coolant, or a refrigerant, while still maintaining the advantages and unique features of the present invention.

One possible implementation of a micro-scaled cooling structure is a micro-channeled cold plate fabricated, e.g., of copper or silicon. A micro-channeled copper cold plate has an advantage of having high thermal conductivity, and thus being effective in spreading heat for convective removal by a cooling liquid. However, copper has a much higher thermal expansion coefficient than silicon, which is typically employed in integrated circuit chips. The thermal expansion coefficient of copper is approximately eight times that of silicon. This difference in thermal expansion between copper and silicon, prevents the use of an extremely thin (and thus thermally superior) interface between a micro-channeled copper cold plate and a silicon chip, and also prevents the use of relatively rigid interfaces such as solder or a thermally cured epoxy. Instead, such a copper cold plate would require the use of a thermal grease interface, which can be as much as two to three times poorer in thermal performance than solder or epoxy interfaces. Thus, although the thermal performance of a micro-channeled copper cold plate is excellent, it can not be placed in correspondingly excellent thermal contact with a conventional electronic device, thus diminishing the overall module thermal performance.

In an alternate implementation, a micro-channeled cold plate could be fabricated of silicon, which can be bonded to a silicon chip via solder or thermally cured epoxy. However, the thermal conductivity of silicon is approximately one-third that of copper, thus making any micro-scaled, finned structure made of silicon less efficient in spreading heat for extraction by the liquid coolant.

Further, in a micro-channeled cold plate, channel dimensions can be exceedingly small, e.g., less than 65 micrometers, which heightens the risk of clogging by micro-particulate contamination over the lifetime of the cooling apparatus. Also, due to the small channel dimensions in a micro-channel heat sink, the pressure drop through such a cooling apparatus can be prohibitively high. A goal of the present invention, therefore, is to alleviate the clogging and pressure drop drawbacks, as well as the drawbacks found in the above described copper and silicon micro-channeled cold plates, while still displaying excellent thermal performance necessary to cool high performance heat flux electronic devices.

Figure 1:
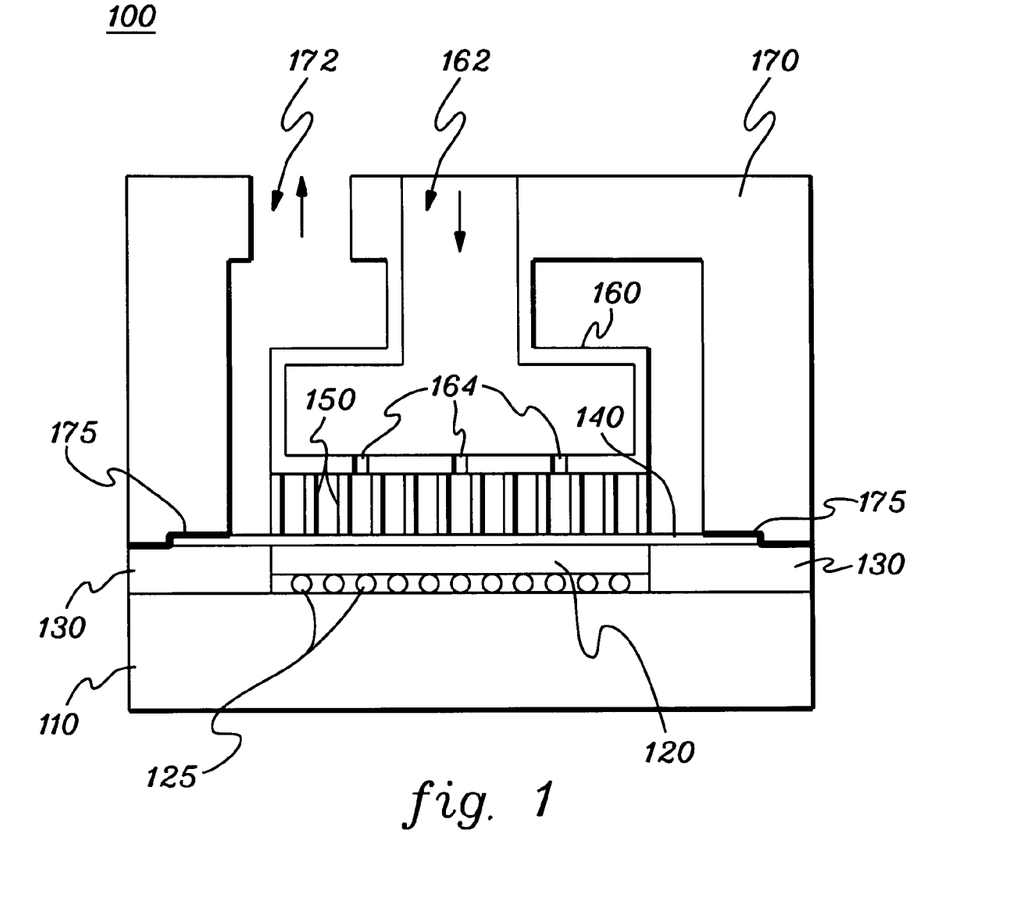
FIG. 1 is a cross-sectional elevational view of one embodiment of a cooled electronic module, in accordance with an aspect of the present invention.

Reference is now made to the drawings, wherein the same reference numbers used throughout different figures designate the same or similar components. FIG. 1 depicts one embodiment of a cooled electronic module, generally denoted 100, in accordance with an aspect of the present invention. In this embodiment, cooled electronic module 100 includes a substrate 110, which may include conductive wiring (not shown) on an upper surface thereof and/or imbedded therein. An integrated circuit chip 120 is electrically connected to the wiring of substrate 110 via, for example, solder ball connections 125. A sealing structure 130 facilitates isolation of the active circuit portion of the integrated circuit 120 from liquid coolant within the module. A base plate 140 covers integrated circuit chip 120 and a portion of the sealing structure 130. A housing 170 is hermetically sealed 175 to base plate 140 and sealing structure 130 via, for example, solder or brazing. Within the housing, a plurality of pin fins 150 extend from base plate 140 into a coolant flow path defined by the housing. In one example, these pin fins each comprise discrete, looped pin fins fabricated of copper. The coolant flow path includes an inlet manifold 160 disposed above, and in the embodiment shown, contacting an upper surface of the plurality of pin fins. Inlet manifold 160 includes an inlet 162 and a plurality of orifices 164, which may comprise micro-scaled orifices. Housing 170 includes a liquid coolant outlet 172 for removal of coolant after contacting the plurality of pin fins 150 and the thermally conductive base 140. Although the manifold scheme depicts central coolant inlets with peripheral outlets, a number of different schemes may be incorporated without departing from the scope of the present invention.

Figure 2:
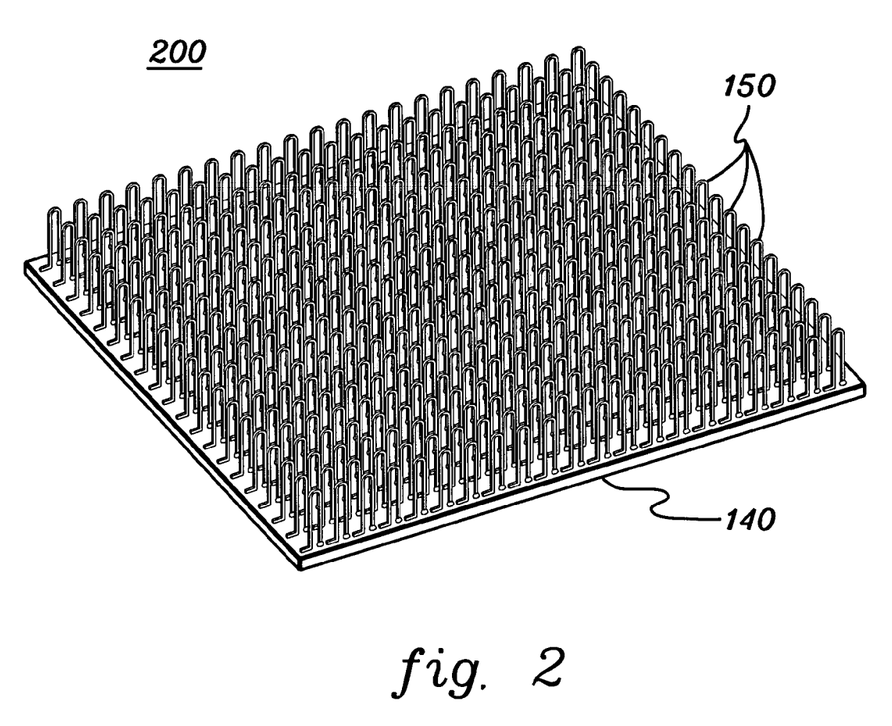
FIG. 2 is an isometric view of one embodiment of a cooling apparatus, in accordance with an aspect of the present invention.

FIG. 2 depicts a perspective view of one embodiment of a micro-scaled cooling structure or apparatus in accordance with an aspect of the present invention. In this example, the structure comprises a cold plate having a thermally conductive base 140 with a substantially planar upper surface from which a plurality of discrete, looped pin fins 150 project in an array. The looped pin fins may comprise copper wire, and the thermally conductive base 140 a material of high thermal conductivity. Base 140 is assumed to have a coefficient of thermal expansion within a defined range of a coefficient of thermal expansion of the electronic device to be cooled, which may, e.g., comprise silicon. In one example, the defined range may be $\pm 1.5 \times 10^{-6}$ 1/K. Assuming that the electronic device comprises silicon, then the coefficient of thermal expansion of the thermally conductive base is preferably in a range of $0.9 \times 10^{-6}$ 1/K to $4.1 \times 10^{-6}$ 1/K.

By way of specific example, the pin fins may be 1-3 mm in height, and have diameters of about 50-250 micrometers, arranged with a pin-to-pin pitch in the 50-500 micrometer range. Thus, the cooling structure 200 of FIG. 2 has the advantage of utilizing a first thermal conductivity material for the fins (e.g., copper), and a second thermal conductivity material for the base, which can be attached to a silicon chip with an excellent interface without concerns related to a coefficient of thermal expansion mismatch (which is a common problem with many previous cooling structures). By way of example, the thermally conductive base 140 could comprise silicon carbide, aluminum nitride, a copper-molybdenum-copper composite, diamond, silicon, etc. The cooling apparatus of FIG. 2 has a large free area and a large free volume ratio, thus making the design significantly less susceptible to clogging over the lifetime of the product compared with a finned micro-channel cold plate such as described above. A simple manifold scheme is sufficient to ensure reliable low pressure drop operation for both single chip module and multichip module applications. Numerous variations to an inline geometry are also possible without departing from the scope of the present invention. Further, in embodiments discussed below, the thermally conductive base 140 could comprise, for example, a back surface of an integrated circuit chip. In addition, the dimensions and shapes of the pin fins are preferably chosen to ensure a large free area and large free volume ratio to minimize susceptibility to clogging. In the event that thicker pin fins are desired, the wire-bonded pin fins can be electroplated to achieve a desired diameter.

In accordance with the present invention, the thermally conductive pin fins are wire-bonded to a substantially planar main surface of the thermally conductive base 140, and as noted, base 140 could comprise a portion of the electronic device to be cooled. For example, base 140 could comprise the integrated circuit chip. Different wire-bonding techniques can be employed to create a looped micro-pin fin array such as depicted in FIG. 2. For example, ball wire-bonding and wedge wire-bonding could be employed, both of which are conventionally used for creating chip-to-substrate interconnections. Numerous wire-bonding machines are available in the art. For example, various ball and wedge wire-bonding machines are manufactured and available through Kulicke & Soffa of Willow Grove, Pa.

Figure 3A:
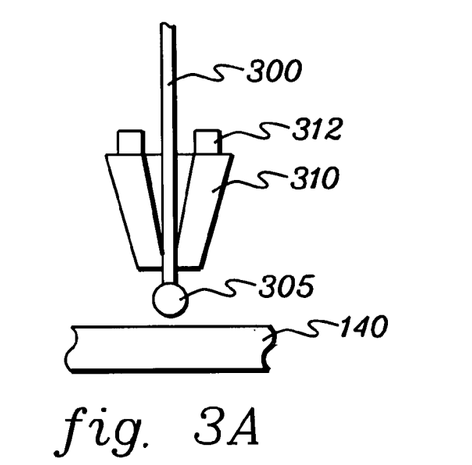
FIG. 3A is an elevational view of a pin fin wire to be wire-bonded to a thermally conductive base during a cooling apparatus fabrication method, in accordance with an aspect of the present invention.

FIGS. 3A-3G illustrate one method for fabricating a cooling apparatus in accordance with the present invention using thermosonic ball-bonding techniques. FIG. 3A depicts the beginning of the manufacturing process, displaying the various elements needed for the process, including a thermally conductive base 140, and a wire 300 that is to comprise the pin fin. Wire 300 includes a ball tip 305 and the tool head that incorporates the wire clamping mechanism includes a capillary passage 310 for the wire. Appropriate metallization (such as chrome-copper or chrome-copper-gold) is assumed to reside on an upper surface of the thermally conductive base 140. In FIG. 3A, the clamping mechanism of the tool head 312 is shown in an unclamped position.

Figure 3B:
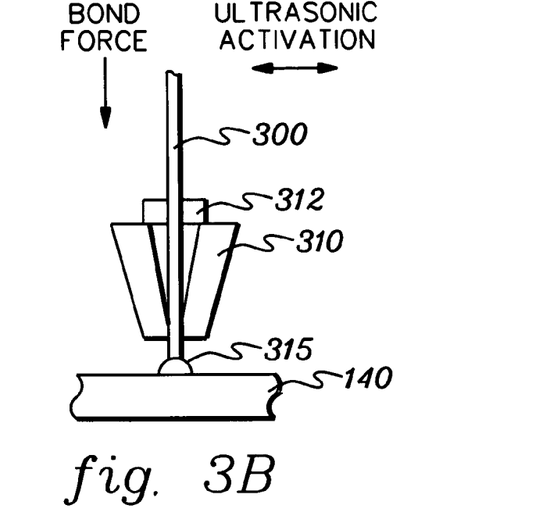
FIG. 3B depicts the structures of FIG. 3A showing the formation of a diffusion weld-bond between the pin fin wire and the thermally conductive base, in accordance with an aspect of the present invention.
Figure 3C:
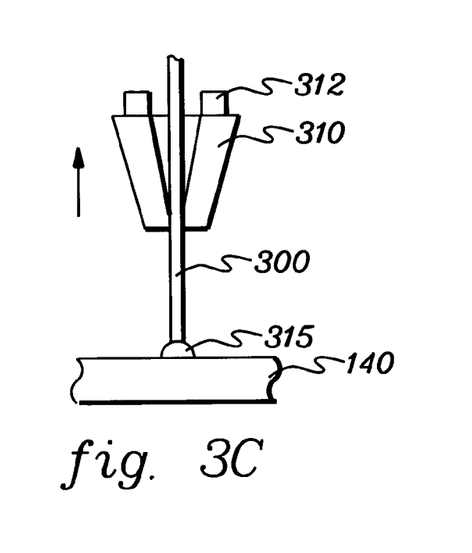
FIG. 3C depicts the structures of FIG. 3B showing the wire-bonding tool head in unclamped position being moved up the wire, in accordance with an aspect of the present invention.

FIG. 3B illustrates the capillary 310 in a clamped position with the motion of the tool head being such as to enable physical contact between the ball tip of wire 300 and the metalized surface of the thermally conductive base 140. A controlled downward bond force is applied in combination with ultrasonic activation, and the two in combination create a physical environment that is conducive to plastic deformation and intermolecular diffusion between wire 300 and the metalized base. A diffusion weld-bond 315 results under these conditions, whereby the plastic deformation at microscopic length scales cause the metal to flow in slip and shear planes across each part of the wire-substrate interface, thus forming a metallurgical diffusion bond. After the bond is formed, the tool head is unclamped, as shown in FIG. 3C, and moved to different position along the length of wire 300, where the capillary is again clamped 310, as shown in FIG. 3D.

Figure 3D:
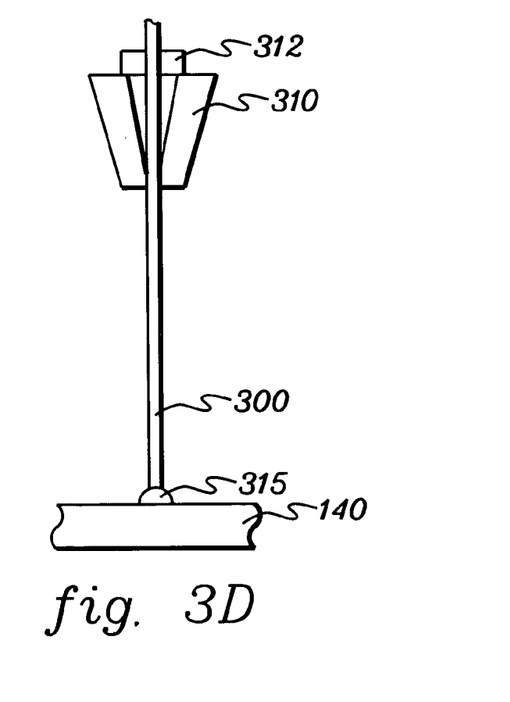
FIG. 3D depicts the structures of FIG. 3C with the wire-bonding tool head reclamped at a higher position along the wire that is to comprise the pin fin, in accordance with an aspect of the present invention.
Figure 3E:
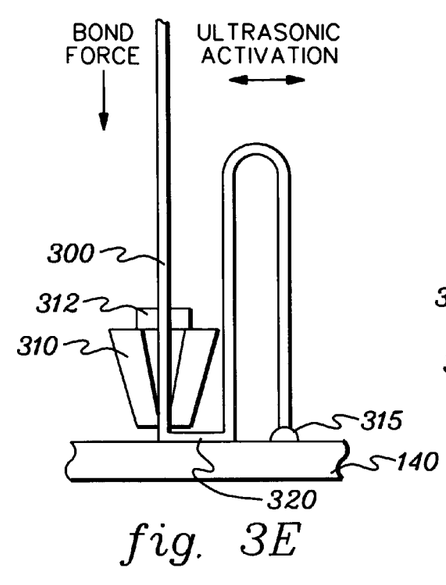
FIG. 3E depicts the structures of FIG. 3D after bending of the wire and formation of another diffusion weld-bond with the thermally conductive base at a further point along the wire, in accordance with an aspect of the present invention.
Figure 3F:
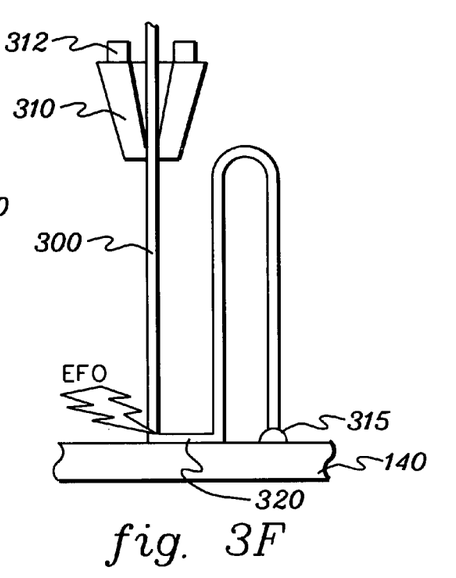
FIG. 3F depicts the structures of FIG. 3E showing the application of an electronic flame off (EFO) to the wire to cut the wire and thereby form the discrete, looped pin fin, in accordance with an aspect of the present invention.
Figure 3G:
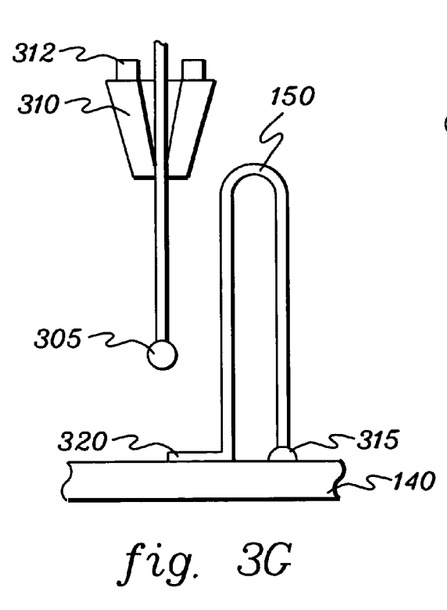
FIG. 3G depicts the structures of FIG. 3F after the wire has been cut and the discrete, looped pin fin formed, in accordance with an aspect of the present invention.

FIG. 3E depicts the assembly of FIG. 3D after the wire has been bent back downward to contact the base 140 and the tool head has been used to form a second diffusion weld-bond 320, thereby ending the pin fin loop. This second bond 320 is a tail which is a result of the process. FIG. 3F shows the tool head removed along the wire 300 to a new position to allow space for an electronic flame off (EFO) operation, which is a process known in the art for cutting a wire. The electronic flame off operation severs wire 300 at the end of second diffusion weld-bond 320, and also creates a new ball tip 305 to allow re-initiation of the process described above, as shown in FIG. 3G. In FIG. 3G, the tool head is in the ready position to repeat the steps illustrated in FIGS. 3A-3F.

Figures 4A, 4B, 4C:
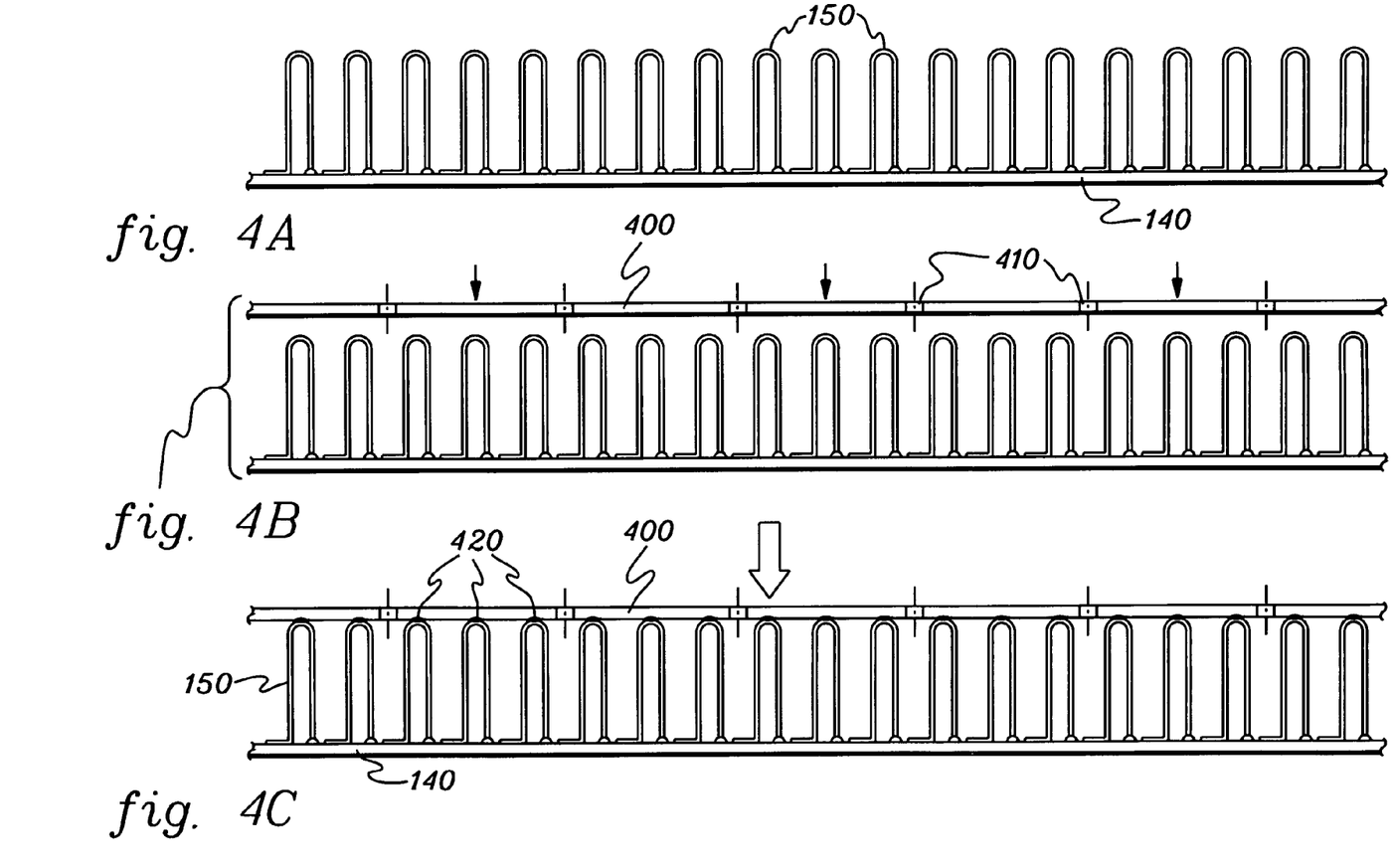
FIG. 4A is an elevational view of one embodiment of a cooling apparatus formed using the fabrication method of FIGS. 3A-3G, in accordance with an aspect of the present invention.
FIG. 4B is an elevational view of the structure of FIG. 4A showing a pre-tinned manifold plate being brought down into physical contact with an upper surface of the discrete, looped pin fins, in accordance with an aspect of the present invention.
FIG. 4C is an elevational view of the structure of FIG. 4B, after the application of heat to reflow solder and thereby physically connect the discrete, looped pin fins and the manifold plate, in accordance with an aspect of the present invention.

After numerous repetitions of the process described in FIGS. 3A-3F, a micro-pin-fin array such as depicted in FIG. 4A can be created. In this array, a plurality of discrete, looped pin fins 150 are closely spaced and diffusion weld-bonded to a thermally conductive base, which as noted above, can comprise part of the electronic device itself to be cooled, or can comprise a separate structure which has a coefficient of thermal expansion closely matched to that of the electronic device to be cooled. FIG. 4B shows a pre-tinned top manifold plate 400 that is brought down to be in slight pressurized contact with the tops of the looped pin fins 150 as shown in FIG. 4C. The manifold plate includes one or more inlet ports or orifices 410, which in one embodiment, may comprise micro-scaled openings. Manifold plate 400 is then heated, for example, by placing the assembly in an oven or by other heating techniques, to reflow the solder and create a rigid joint 420 between the tops of the pin fins 150 and manifold plate 400. Such solder joints serve to increase the rigidity of the pin fins, thus reducing any propensity of the fins to deform when subjected to high velocity cross-flow of a liquid coolant.

Figure 5:
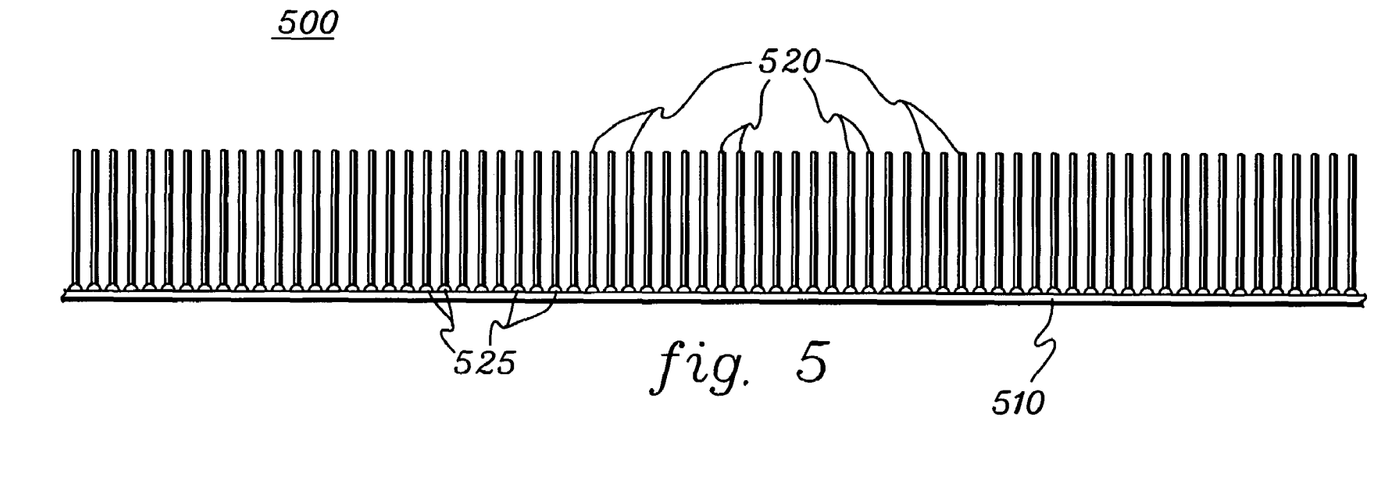
FIG. 5 is an elevational view of an alternate embodiment of a cooling apparatus, in accordance with an aspect of the present invention.

FIG. 5 depicts an alternate embodiment of a cooling apparatus in accordance with the present invention. In this embodiment, straight pin fins 520 are shown extending from a substantially planar surface of a substrate 510, which again is assumed to comprise a thermally conductive base. The pin fins 520 are diffusion weld-bonded 525 to base 510, for example, via thermosonic weld-bonding such as described above. Fabrication of this cooling apparatus can employ the process of FIGS. 3A-3G, with the electronic flame-off operation described in FIG. 3F occurring earlier, for example, at the step depicted in FIG. 3D.

Process cycle times for forming the diffusion bonds of FIGS. 3A-5 are less than 20 milliseconds. Thus, to create a high performance pin fin array such as depicted in FIG. 2, wherein 2500 pin fins are employed to cool a surface of 1 $cm^2$ (and hence 2500 bonds), the bonding process time can be estimated to be about 50 seconds. This is a reasonable time for cost effective production of a single cooling apparatus such as described herein. Further, those skilled in the art will note that wire-bonding machines are advanced computer controlled machines that can be programmed to create non-uniform patterns of arrays that represent different embodiments of the design depicted in FIGS. 2-5.

As noted briefly, another technique which can be used to create enhanced heat transfer fin structures is a wedged bonding approach. The process times for wedge bonding, have been reported to be less than 80 milliseconds per bond, which again allows for a practical implementation of the concepts disclosed herein.

Advantageously, the structures described herein provide excellent thermal interface due to the metallurgical nature of a wire-bond, and due to the absence of a third material, such as solder or braze compound, between the pin fins and the base. The wire-bonding approach described is particularly beneficial when creating a silicon-to-copper pin bond, for example, for the discrete, looped micro-pin-fins. The pin fin to substrate bonds are created using a wire bonding process that employs ultrasonic activation, and establishes a diffusion weld-bond between surfaces that are metallurgically clean, e.g., free of oxides, and which is highly energetic. These interface properties make for an excellent thermal interface of low thermal resistance. FIGS. 3B-3G illustrate the shape of the fin at its base, directly above the silicon-to-copper pin bond. This hemispherical shape allows for a larger surface area at the bond, approximately 2-4 times the diameter of the wire itself, thus significantly increasing the contact area, thereby reducing the interface/contact thermal resistance at the interface. The thermal interface resistance at these pin-to-base interfaces is inversely proportional to the area of contact. Additionally, the hemispherical diffusion weld-bond shape allows for "thermal merging" as the heat flows from the large cross-sectional area of the thermally conductive base, to the smaller cross-sectional area of the pin fins, thereby reducing the constriction resistance of the fin structure to heat flow.

Figure 6:
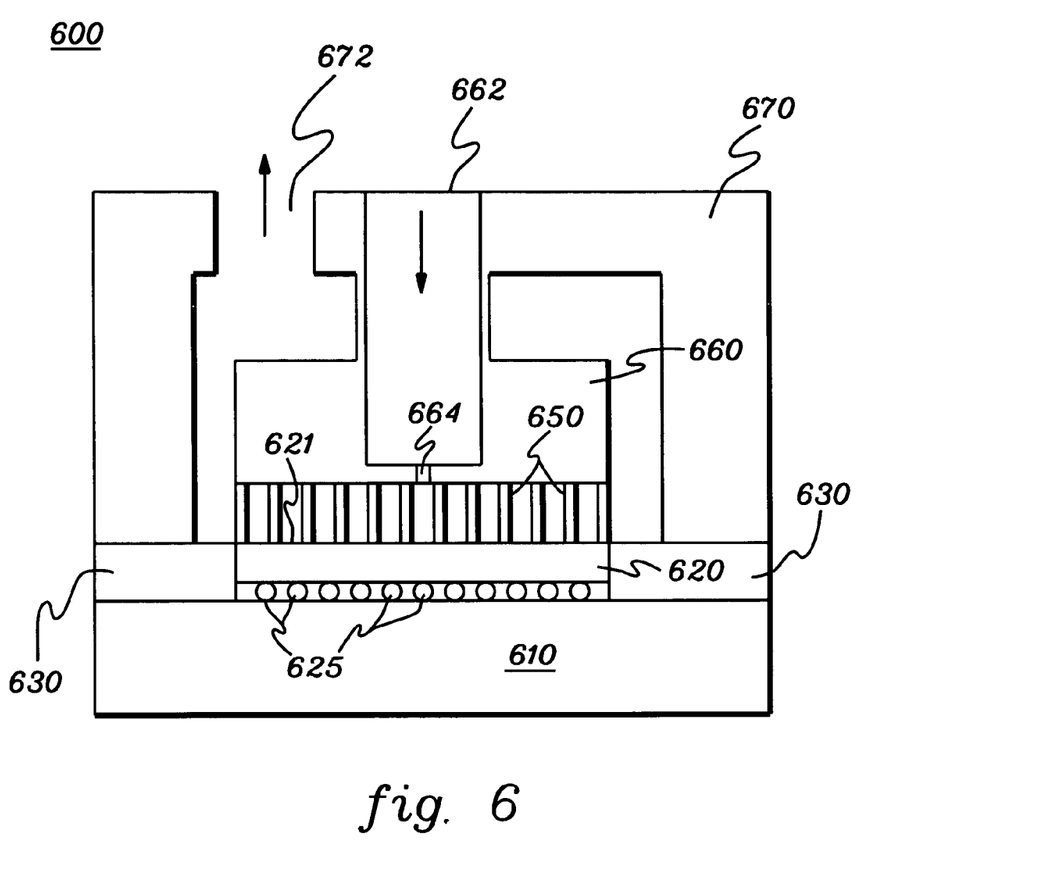
FIG. 6 is a cross-sectional elevational view of an alternate embodiment of a cooled electronic module, in accordance with an aspect of the present invention.
Figure 7:
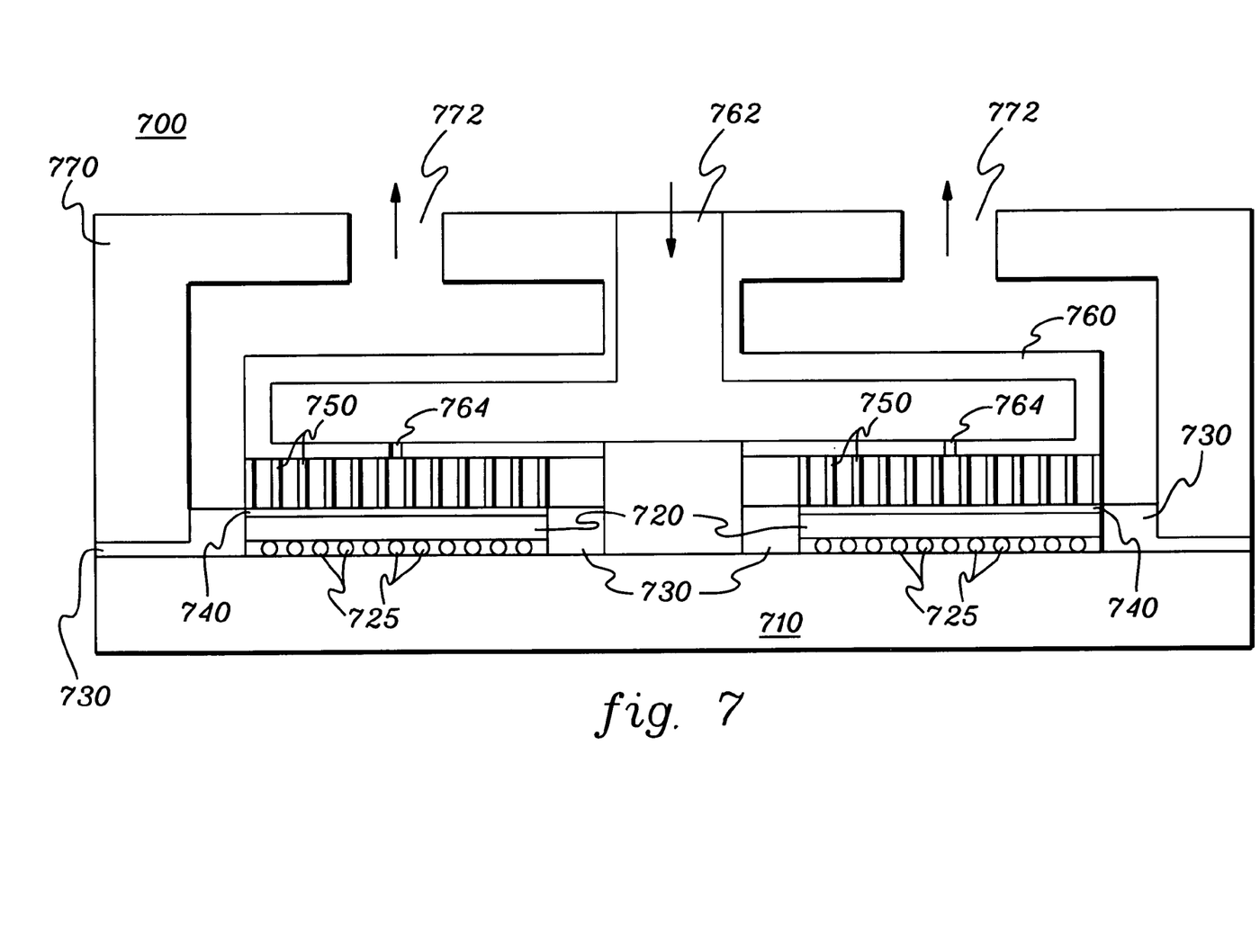
FIG. 7 is a cross-sectional elevational view of another embodiment of a cooled electronic module, in accordance with an aspect of the present invention.
Figure 8:
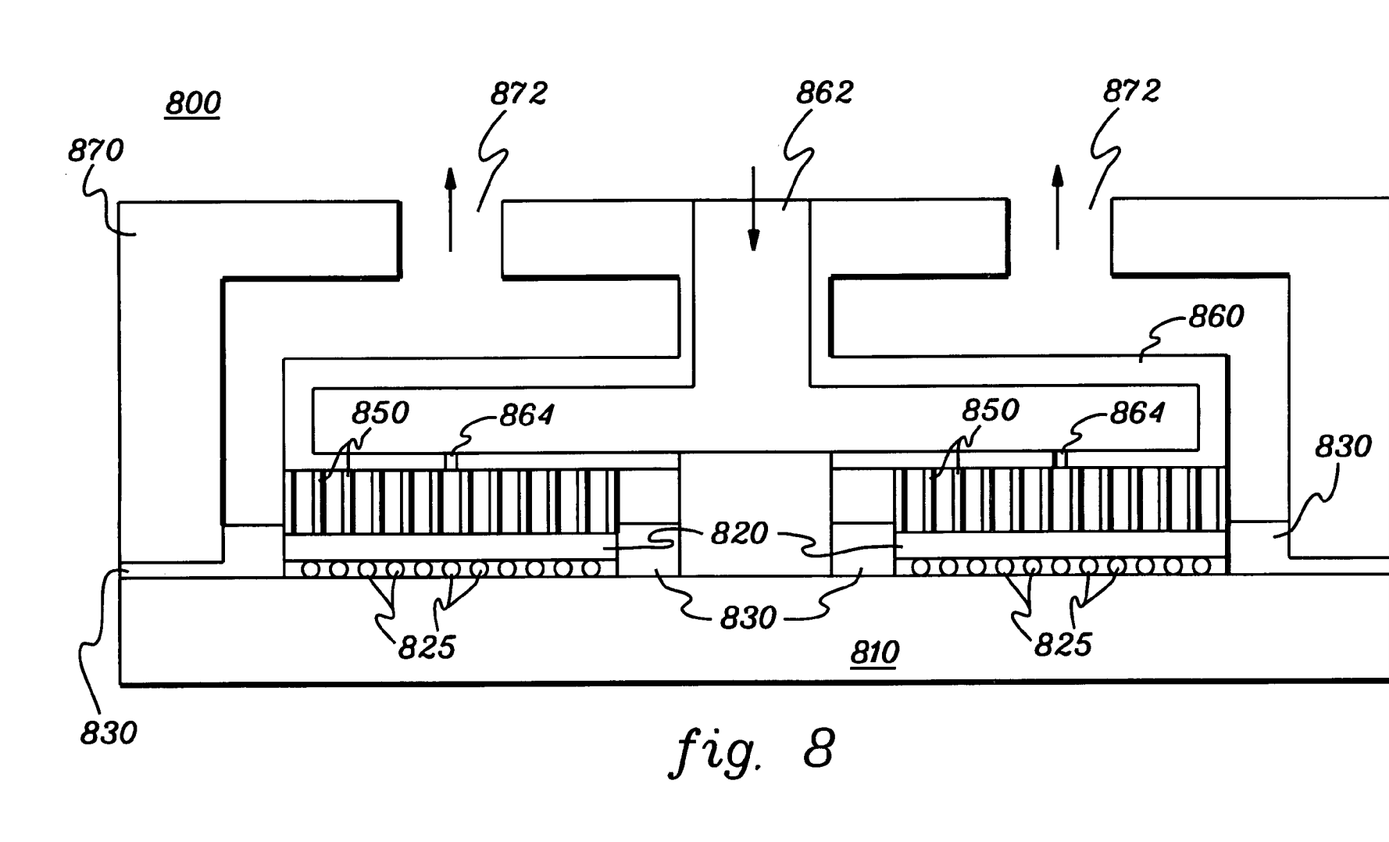
FIG. 8 is a cross-sectional elevational view of still another embodiment of a cooled electronic module, in accordance with an aspect of the present invention.

FIGS. 6-8 depict alternate embodiments of cooled electronic modules employing a cooling apparatus in accordance with the present invention. In FIG. 6, a substrate 610 again supports and is electrically connected to an electronic device 620 via a plurality of interconnects, such as solder ball connections 625. Sealing structures 630 isolate the active componentry of device 620 from the cooling liquid flowing within housing 670. Housing 670, in this example, is sealed directly to the sealing structure 630 and creates a cavity within which an inlet manifold 660 is provided. Inlet manifold 660 includes an inlet 662 and one or more orifices 664 for directing cooling liquid onto a surface of the electronic device to be cooled 620. A plurality of pin fins 650 are shown interconnected between the electronic device 620 and the inlet manifold 660. Again, pin fins 650 may comprise discrete, looped pin fins manufactured of copper in a manner similar to that described above in connection with FIGS. 3A-4C. In this embodiment, however, the looped pin fins are wire-bonded directly onto the surface of the electronic device, to thus create the fin structure for direct liquid cooling. Further, in this embodiment, the electronic device may be passivated from the liquid coolant via an impermeable barrier (not shown) such as described in co-pending, commonly assigned U.S. patent application Ser. No. 10/197,661, filed Jul. 17, 2002, by Chu et al., entitled "Electronic Device Substrate Assembly With Multi-Layer Impermeable Barrier And Method of Making," the entirety of which is hereby incorporated herein by reference.

FIGS. 7 & 8 depict examples of cooled electronic modules which comprise multichip modules. In FIG. 7, the cooled electronic module 700 includes a substrate 710 supporting multiple electronic devices 720, which in one example may comprise bare integrated circuit chips. Devices 720 are shown electrically interconnected via solder ball connections 725 to metallization on or embedded within the substrate 710 supporting the electronic devices. Appropriate sealing structures 730 facilitate sealing the electronic devices 720 from the liquid coolant. A thermally conductive base 740 is shown coupled to each electronic device. Each base 740 is assumed to comprise a thermally conductive base material which has a coefficient of thermal expansion within a defined range of the coefficient of thermal expansion of the respective electronic device to be cooled. As one example, the electronic device may comprise silicon, and the defined range may be $\pm 1.5 \times 10^{-6}$ 1/K from the coefficient of thermal expansion of silicon. As noted above, the thermally conductive base may comprise various materials, including, silicon carbide, aluminum nitride, diamond, a copper-molybdenum-copper composite, silicon, etc. A plurality of pin fins 750 extend from a substantially planar surface of the thermally conductive base 740. In one example, these pin fins may comprise discrete, looped pin fins such as those described above in connection with FIGS. 3A-4C. An inlet plenum 760 rests on, and may be soldered or brazed to, the plurality of pin fins 750. Inlet plenum 760 includes a coolant inlet 762 and one or more orifices 764 disposed over respective cooling apparatuses 740, 750 coupled to the electronic devices 720. Housing 770 is again sealed to the sealing structure 730 and defines an inner liquid coolant flow path through which liquid coolant flows from orifices 764 to one or more exits 772 in the housing 770.

FIG. 8 depicts another alternate embodiment of a cooled electronic module 800, which is again a multichip module, wherein pin fins 850 are directly wire-bonded to the electronic devices 820, such as integrated circuit chips. The electronic devices 820 are electrically connected 825 to a supporting substrate 810, and a sealing structure 830 facilitates isolation of the active circuitry of the electronic devices. An appropriate liquid impermeable passivation layer (not shown) could reside atop the electronic devices depending upon the liquid coolant employed. The plurality of pin fins 850 comprise (in one example) discrete, looped pin fins fabricated of copper. These pin fins are diffusion weld-bonded to the exposed surfaces of the electronic devices 820. Housing 870 is a manifold structure which defines a liquid coolant flow path from an inlet 862 in an inlet plenum 860 through inlet orifices 864 to one or more coolant outlets 872.

By way of further example, analysis was performed to characterize cooling for a silicon chip of 0.75 mm thickness and 1 cm$^2$ footprint area, with a micro-pin cooling apparatus as presented herein. The geometry modeled represented looped pin arrays with 2500 pins per square centimeter, each 1 mm tall, and 50 or 75 micrometers in diameter, and arranged orthogonally in two dimensions with a pitch of 100 micrometers and 200 micrometers, respectively. In a flow distribution similar to that illustrated in FIGS. 6-8, coolant entered from a center of the finned cooling structure and exited from the periphery. Water was utilized as the coolant, at a volumetric flow rate of 0.25 gallons per minute for the entire 1 cm$^2$ chip. The pin fins were made of copper and the cooling apparatus was assumed to comprise a heat sink base of 125 micron silicon carbide that was soldered to a silicon chip. Results illustrate excellent thermal performance of 310-370 W/cm$^2$ with a chip to ambient temperature difference of 60° C., and relatively low pressure drops of between 1.2-1.5 psi for the two pin diameters of 50 and 75 micrometers, respectively.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims. For example the cooling apparatus disclosed herein could be employed within a cooled electronic module wherein a liquid coolant cross-flow across the cooling apparatus is established rather than a center to peripheral flow, and wherein the coolant employed could change phase under typical operating conditions.

What is claimed is:

1. A cooling apparatus comprising:
  a thermally conductive base having a main surface;
  a plurality of thermally conductive pin fins wire-bonded to the main surface of the thermally conductive base, wherein each pin fin of the plurality of thermally conductive pin fins is bonded to the main surface of the thermally conductive base via a metallurgical diffusion bond of the pin fin to the main surface of the thermally conductive base, the plurality of thermally conductive pin fins being disposed to facilitate transfer of heat from the thermally conductive base; and
  wherein the plurality of thermally conductive pin fins comprise a plurality of discrete, looped pin fins, each discrete, looped pin fin comprising a first end and a second end, and being separately wire-bonded at its first end and its second end to the main surface of the thermally conductive base employing a first metallurgical diffusion bond at its first end and a second metallurgical diffusion bond at its second end.

2. The cooling apparatus of claim 1, wherein the main surface of the thermally conductive base is a flat, planar surface and the plurality of thermally conductive pin fins are each thermally merged with the main surface of the thermally conductive base via the metallurgical diffusion bond thereof to the flat, planar main surface of the thermally conductive base.

3. The cooling apparatus of claim 1, wherein the thermally conductive base is a back surface of an electronic device to be cooled, the electronic device being at least one of an integrated circuit chip or multiple integrated circuit chips fabricated of a semiconductor material.

4. The cooling apparatus of claim I, wherein the thermally conductive base comprises a non-metallic structure and has a coefficient of thermal expansion within a defined range of a coefficient of thermal expansion of an electronic device to be cooled by the cooling apparatus, the defined range being ±1.5×10$^{-6}$1/K.

5. The cooling apparatus of claim 1, further comprising a housing sealably engaging the main surface of the thermally conductive base, the housing defining a liquid coolant flow path within which the plurality of thermally conductive pin fins extend, wherein heat is transferred in part from the thermally conductive base through the plurality of thermally conductive pin fins to liquid coolant within the liquid coolant flow path when the cooling apparatus is employed to cool an electronic device coupled to the thermally conductive base.

6. The cooling apparatus of claim 1, wherein the cooling apparatus is a micro-scaled cooling structure, and wherein at least some of the thermally conductive pin fins of the plurality of thermally conductive pin fins are spaced less than 300 micrometers apart in a planar array across the main surface of the thermally conductive base.

7. A cooled electronic module comprising:
  a substrate and at least one heat generating electronic device attached thereto; and
  a cooling apparatus for cooling the at least one heat generating electronic device, the cooling apparatus comprising:
    a plurality of thermally conductive pin fins wire-bonded to one of a surface of the at least one heat generating electronic device or a thermally conductive base coupled to a surface of the at least one heat generating electronic device, wherein each pin fin of the plurality of thermally conductive pin fins is bonded to the one of the surface of the at least one heat generating electronic device or the thermally conductive base coupled thereto via a metallurgical diffusion bond of the pin fin thereto, and wherein the plurality of thermally conductive pin fins are disposed to facilitate transfer of heat from the at least one heat generating electronic device; and wherein the plurality of thermally conductive pin fins comprise a plurality of discrete, looped pin fins, each discrete, looped pin fin comprising a first end and a second end, and being separately wire-bonded at its first end and its second end to the one of the surface of the at least one heat generating electronic device or the thermally conductive base coupled to the surface of the at least one heat generating electronic device employing a first metallurgical diffusion bond at its first end and a second metallurgical diffusion bond at its second end.

8. The cooled electronic module of claim 7, wherein the one of the surface of the at least one heat generating electronic device or the thermally conductive base coupled to the surface of the at least one heat generating electronic device comprises a flat, planar surface, and wherein the wire-bonded pin fins of the plurality of thermally conductive pin fins are each thermally merged with the flat, planar surface.

9. The cooled electronic module of claim 7, wherein the plurality of thermally conductive pin fins are wire-bonded to the thermally conductive base, which is coupled to the surface of the at least one heat generating electronic device, and wherein the thermally conductive base comprises a non-metallic structure and has a coefficient of thermal expansion within a defined range of a coefficient of thermal expansion of the at least one heat generating electronic device, the defined range being ±1.5 ×10$^{-6}$ 1/K.

10. The cooled electronic module of claim 9, wherein the at least one heat generating electronic device comprises silicon, and wherein the thermally conductive base comprises at least one of silicon carbide, silicon, aluminum nitride, diamond, and a copper-molybdenum-copper composite, and wherein the plurality of thermally conductive pin fins comprise copper.

11. The cooled electronic module of claim 7, wherein the cooling apparatus is a micro-scaled cooling structure, and wherein at least some thermally conductive pin fins of the plurality of thermally conductive pin fins are spaced less than 300 micrometers apart in a planar array.

12. The cooled electronic module of claim 7, further comprising a housing sealably coupled to the substrate, the housing defining a liquid coolant flow path within which the plurality of thermally conductive pin fins extend, wherein heat is transferred from the at least one heat generating electronic device through the plurality of thermally conductive pin fins to liquid coolant within the liquid coolant flow path, and wherein at least some pin fins of the plurality of thermally conductive pin fins are soldered intermediate their first and second ends to a coolant inlet manifold structure.

13. The cooled electronic module of claim 7, further comprising:

a housing sealably coupled to the substrate, the housing defining a liquid coolant flow path within which the plurality of thermally conductive pin fins extend;

wherein the housing comprises a coolant inlet manifold with at least one orifice disposed over the one surface to which the plurality of thermally conductive pin fins are bonded, the at least one orifice for injecting coolant onto the at least one surface, wherein heat is transferred from the at least one heat generating electronic device through the plurality of thermally conductive pin fins to the injected coolant, and at least some pin fins of the plurality of conductive pin fins are soldered intermediate their first and second ends to the coolant inlet manifold; and wherein the housing further comprises a coolant outlet manifold for removal of coolant after contacting the one surface and the plurality of thermally conductive pin fins, the coolant outlet manifold being disposed at the periphery of the at least one heat generating electronic device.

14. The cooled electronic module of claim 13, wherein the plurality of thermally conductive pin fins are bonded directly to the surface of the at least one heat generating electronic device, and wherein the surface of the at least one heat generating electronic device is a back surface of an electronic device to be cooled, the electronic device being at least one of an integrated circuit chip or multiple integrated circuit chips fabricated of a semiconductor material, wherein the back surface of the electronic device is a flat, planar surface and the plurality of thermally conductive pin fins are each thermally merged with the back surface of the electronic device by a metallurgical diffusion bond thereon and wherein the cooling apparatus is a micro-scaled cooling structure, and at least some of the thermally conductive pin fins of the plurality of thermally conductive pin fins are spaced less than 300 micrometers apart in a planar array across the back surface of the electronic device.

15. A method of fabricating a cooling apparatus comprising:

providing a thermally conductive base having a main surface;

wire-bonding a plurality of thermally conductive pin fins to the main surface of the thermally conductive base, wherein each pin fin of the plurality of thermally conductive pin fins is bonded to the main surface of the thermally conductive base via a metallurgical diffusion bond of the pin fin to the main surface of the thermally conductive base, and wherein the plurality of thermally conductive pin fins are disposed across the main surface to facilitate transfer of heat from the thermally conductive base; and wherein the plurality of thermally conductive pin fins comprise a plurality of discrete, looped pin fins, each discrete, looped pin fin comprising a first end and a second end, and being separately wire-bonded at its first end and its second end to the main surface of the thermally conductive base employing a first metallurgical diffusion bond at its first end and a second metallurgical diffusion bond at its second end.

16. The method of claim 15, wherein the main surface of the thermally conductive base is planar and the wire-bonding comprises for each thermally conductive pin fin, thermally merging the thermally conductive pin fin to the planar main surface of the thermally conductive base via the metallurgical diffusion bond thereof to the planar main surface of the thermally conductive base.

17. The method of claim 15, wherein the wire-bonding comprises for each thermally conductive pin fin forming the discrete, looped pin fin thermally merged with the thermally conductive base, and wherein at least some thermally conductive pin fins of the plurality of thermally conductive pin fins are spaced less than 300 micrometers apart in a planar array across the main surface of the thermally conductive base.

18. The method of claim 15, wherein the thermally conductive base is a back surface of an electronic device to be cooled, the electronic device being at least one of an integrated circuit chip or multiple integrated circuit chips fabricated of a semiconductor material.

19. The method of claim 15, wherein the thermally conductive base comprises a non-metallic structure and has a coefficient of thermal expansion within a defined range of a coefficient of thermal expansion of an electronic device to be cooled by the cooling apparatus, the defined range being $\pm 1.5 \times 10^{-6}$ 1/K.

20. The method of claim 15, further comprising providing a housing sealably engaged to the main surface of the thermally conductive base, the housing defining a liquid coolant flow path within which the plurality of thermally conductive pin fins extend, wherein heat from an electronic device to be cooled is transferred in part from the thermally conductive base through the plurality of thermally conductive pin fins to liquid coolant within the liquid coolant flow path when the electronic device is coupled to the thermally conductive base.

* * * * *